United States Patent
Keller

[19]

[11] Patent Number: 5,880,034
[45] Date of Patent: Mar. 9, 1999

[54] REDUCTION OF SEMICONDUCTOR STRUCTURE DAMAGE DURING REACTIVE ION ETCHING

[75] Inventor: John H. Keller, Newburgh, N.Y.

[73] Assignee: Princeton University, Princeton, N.J.

[21] Appl. No.: 841,218

[22] Filed: Apr. 29, 1997

[51] Int. Cl.[6] .................................................. H01L 21/00
[52] U.S. Cl. ............................ 438/732; 156/345; 216/70
[58] Field of Search ..................... 156/345 ME, 345 MG; 216/67, 70; 438/732, 728; 204/298.37, 298.38

[56] References Cited

U.S. PATENT DOCUMENTS

| | | | |
|---|---|---|---|
| 4,740,268 | 4/1988 | Bukhman . | |
| 5,133,825 | 7/1992 | Hakamata et al. | 156/345 |
| 5,346,579 | 9/1994 | Cook et al. | 156/345 |
| 5,440,206 | 8/1995 | Kurono et al. . | |
| 5,534,108 | 7/1996 | Oian et al. | 156/345 X |

FOREIGN PATENT DOCUMENTS

| | | |
|---|---|---|
| 61-86942 | 5/1986 | Japan . |
| 63-243286 | 10/1988 | Japan . |
| 6-342698 | 12/1994 | Japan . |

*Primary Examiner*—William Powell
*Attorney, Agent, or Firm*—Glenn E. Karta

[57] ABSTRACT

Uniformity of plasma density and potential are increased by reducing plasma confinement through use of a non-uniform, graded magnetic field by asymmetric energization of electromagnets with a waveform including harmonics of a fundamental frequency. The magnetic field strength or intensity decreases in the direction of ExB drift of energetic electrons within the plasma which tends to cause additional ionization in the plasma and a gradient of plasma density and potential. Thus, increase in ionization due to ExB drift is balanced by reduction of plasma confinement. Uniformity of average exposure to the plasma is further increased by rotation of the magnetic field. Uniformity of plasma potential or wafer bias is further improved by modulation of the radio frequency (RF) power used to form the plasma in synchronism with decreases in the magnetic field during switching for magnetic field rotation.

18 Claims, 4 Drawing Sheets

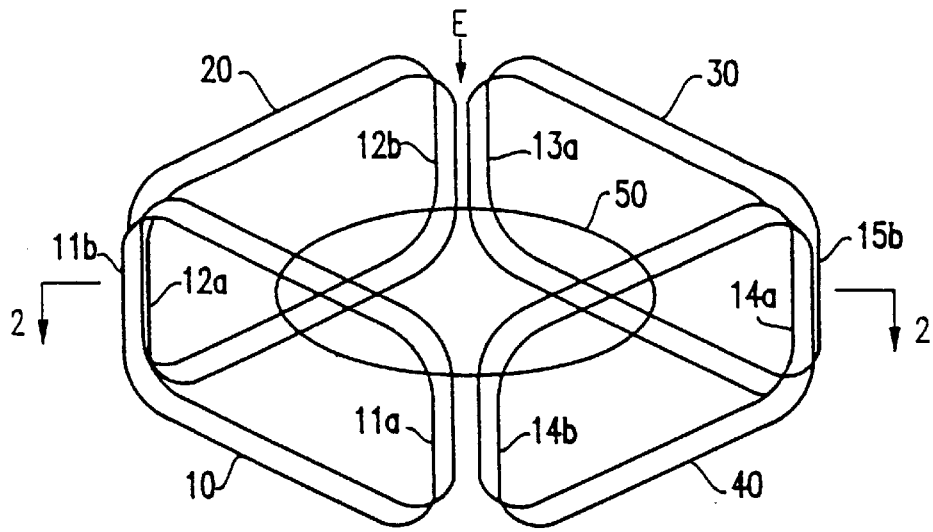
FIG.1
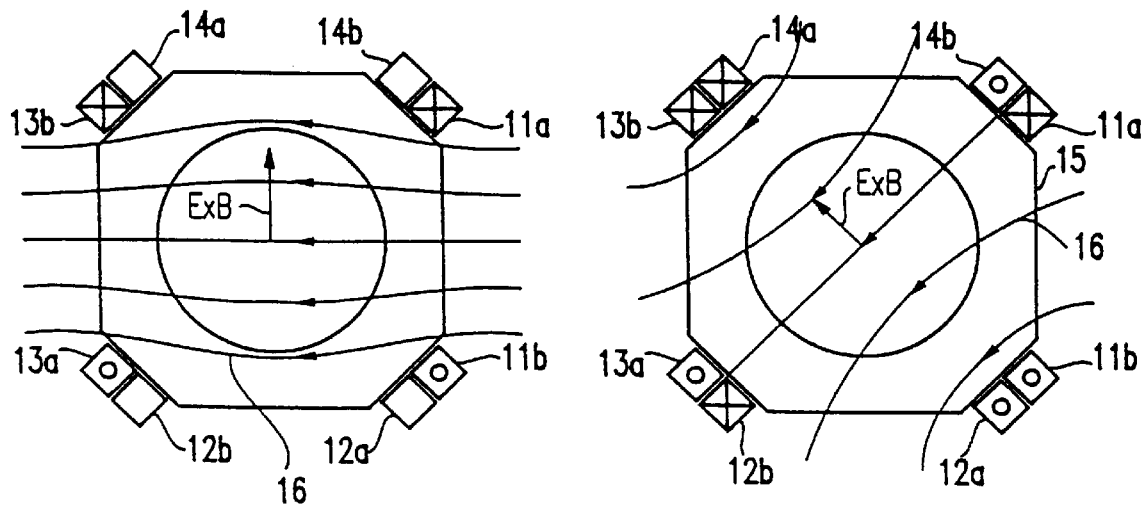
FIG.2A
RELATED ART
FIG.2B
RELATED ART
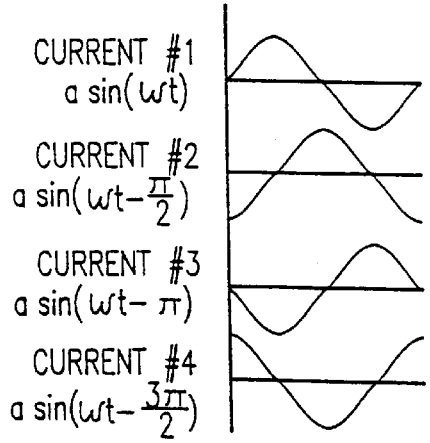
FIG.2C
CURRENT #1
$a \sin(\omega t)$
CURRENT #2
$a \sin(\omega t - \frac{\pi}{2})$
CURRENT #3
$a \sin(\omega t - \pi)$
CURRENT #4
$a \sin(\omega t - \frac{3\pi}{2})$ CURRENT #1, COIL 10
$I_1 = F(t)$ CURRENT #2, COIL 20
$I_2 = F(t - \frac{\pi}{2})$ CURRENT #3, COIL 30
$I_3 = F(t - \pi)$ CURRENT #4, COIL 40
$I_4 = F(t - \frac{3\pi}{2})$ 110 120 130 140

CURRENT #1
$I_1 = G(t)$

CURRENT #2
$I_2 = G(t - \frac{\pi}{2})$

CURRENT #3
$I_3 = G(t - \pi)$

CURRENT #4
$I_4 = G(t - \frac{3\pi}{2})$

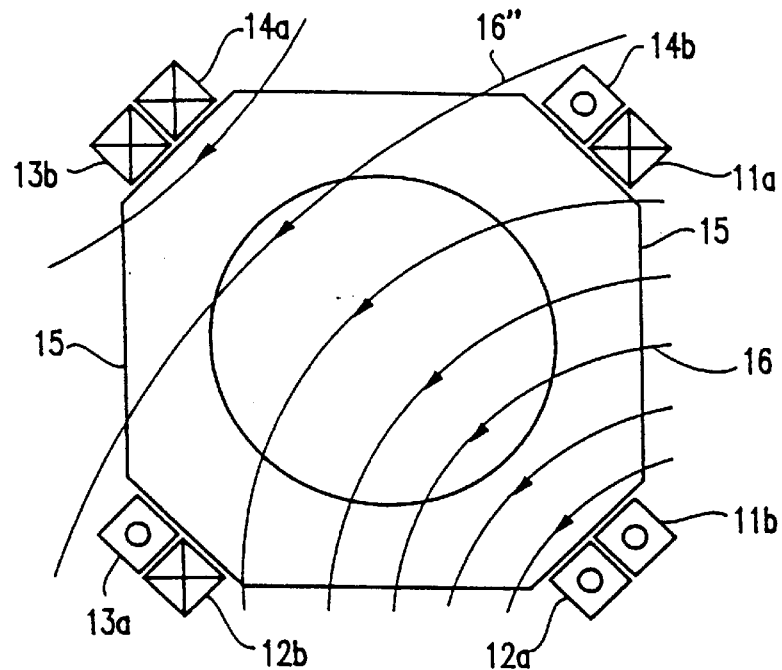
FIG.4C
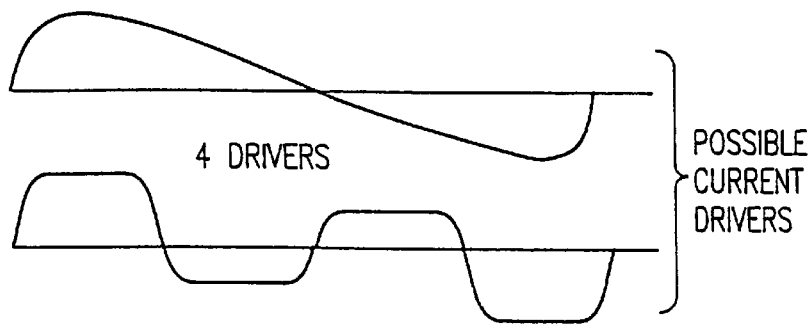
FIG.5A
FIG.5B
4 DRIVERS } POSSIBLE CURRENT DRIVERS
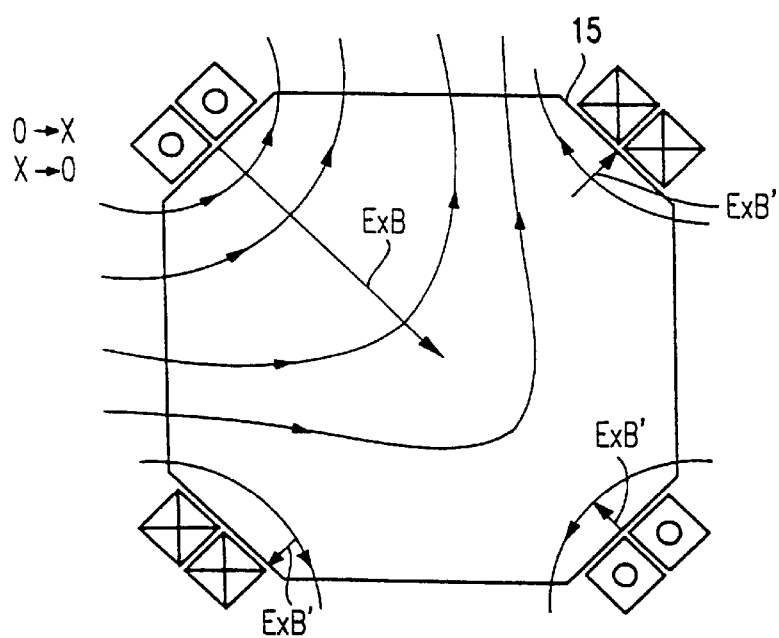
FIG.6

REDUCTION OF SEMICONDUCTOR STRUCTURE DAMAGE DURING REACTIVE ION ETCHING

BACKGROUND OF THE INVENTION

1. Field of the Invention

The present invention generally relates to the manufacture of semiconductor devices and, more particularly, to the performance of reactive ion etching and the reduction of damage to semiconductor wafers and earlier formed structures during reactive ion etching.

2. Description of the Prior Art

Scaling of electronic element structures to smaller sizes in semiconductor integrated circuits having increased integration density (to obtain improvements in propagation speed, noise immunity and economy of manufacture) has increased the criticality of many wafer processing operations. At the same time, there has also been a trend to increase wafer size to permit process costs to be spread over an increasing number of chips which may compromise the accuracy with which processing can be performed. For example, reactive ion etching is generally considered to be a relatively rapid, well-controlled process useful at numerous stages of integrated circuit manufacture but has presented criticality which has compromised manufacturing yields in modern integrated circuit designs.

During reactive ion etching, a plasma generated by radio frequency (RF) electric field energy and confined by a magnetic field (to increase plasma density and allow reduction of RF energy and bias) is used to develop charged species (electrons and ions). An etchant is introduced into the chamber 15 and ionized and the ions are accelerated toward a wafer by an electric field to etch the surface thereof in a manner well-understood in the art. The speed of the etching process and throughput of the apparatus in which it is conducted is dependent on the density of the plasma adjacent a particular region of the wafer and it is generally desirable to form a plasma with a high density of charged species. By the same token, however, the density of plasma to which the wafer is exposed must, at least on average, be substantially uniform to achieve the same etch rate at all points on the wafer surface particularly for very large diameter wafers.

Reactors for the performance of reactive ion etching must accommodate at least one wafer and thus are of sufficient size to allow local variations and non-uniformity in density of the plasma. Therefore, it has become the practice to use a rotating magnetic field above the wafer to cause the plasma to be repeatedly swept across the surface of the wafer to increase uniformity of exposure of the wafer to the plasma even when the plasma density is not uniform.

However, both increase in size of reactor chambers to accommodate larger wafers and increases in process criticality as electronic elements are scaled to smaller sizes has resulted in damage to wafers due to plasma non-uniformity becoming a significant factor in manufacturing yield. At larger reactor or wafer sizes, a magnetron effect causes a gradient of plasma density across the wafer. The gradient of plasma density, in turn, produces a variation of plasma potential across the wafer because of the tendency of energetic electrons from the plasma to drift in a direction perpendicular to both the magnetic field and the electrical field, referred to as the ExB drift. This drift of electrons causes additional ionization which produces further energetic electrons to contribute to the electron drift and further contribute to the gradient of plasma density across the wafer.

It can be understood that this effect will increase for larger reactor and wafer sizes and can become great enough to damage thin gate oxide films in FET arrays and other structures which become very thin when scaled to smaller sizes for higher integration density.

On the other hand, if no magnetic field is used to increase plasma density, an increased bias voltage of about 1 KV or higher is necessary to maintain a sufficient density of plasma above the wafer for reactive ion etching to proceed at an acceptable rate. However, this large bias voltage is sufficient to cause X-ray damage to oxides and lattice damage to the wafer. Therefore, it is the practice to use both a magnetic field and reduced electric field bias for reactive ion etching. However, the ExB drift (and its effect on non-uniform plasma density) is, of course, a function of both electrical and magnetic field strength or intensity and the plasma density developed, which, for a given reactor or wafer size, effectively places a limitation on the magnitude of both the electrical bias and magnetic field which can be used, limiting throughput of the reactor.

An article entitled "Reduction of Charge-up Damage in Magnetron RIE" by Yukimasa Yoshida, published in Electrochemical Society Proceedings, Vol 95-5, pages 236–245, reports that uniform magnetic fields near the wafer surface cause damage and that damage can be reduced by using a non-uniform magnetic field in a magnetron RIE reactor using a rotating plurality of permanent magnets to obtain increased uniformity of plasma density and plasma potential. However, permanent magnets do not allow the magnetic field to be varied to optimize the plasma density or magnetic field gradient in accordance with desired manufacturing process parameters and require substantial mechanical support and mechanisms to rotate them and, hence, are impractical for integrated circuit production. On the contrary, RIE reactors which have become standard in the industry generate rotating magnetic fields by applying varying currents to stationary coils in a sequence to provide a rotating magnetic field. Such arrangement do not readily lend themselves to the simultaneous production of a rotating magnetic field which is also non-uniform since any variation of coil geometry which would create magnetic field non-uniformity would be superposed with other non-uniformities from other coils as the magnetic field was rotated. That is, the gradient in magnetic field strength which might be developed for one coil would not be maintained for a plurality of coils energized by currents of differing phase to obtain field rotation. Further, since the coils currently existing in current commercial reactors constitute an expensive component thereof, alteration of coil geometry is not economically feasible to obtain a suitable non-uniformity of a magnetic field which must also rotate.

SUMMARY OF THE INVENTION

It is therefore an object of the present invention to provide a rotating non-uniform magnetic field in which the magnetic field is reduced in the direction of ExB drift in a reactor for reactive ion etching processes.

It is another object of the invention to provide reduction of charge-up damage, X-ray damage and wafer lattice damage during reactive ion etching, particularly in large reactors or for large wafers.

It is a further object of the invention to reduce throughput limitations imposed by magnetic and electric field strength and resultant gradients in plasma density and plasma potential due to ExB electron drift.

It is another further object of the invention to provide for increase of RF wafer electrode power without causing increase of plasma density or non-uniformity above the wafer.

It is yet another object of the invention to provide increased plasma density and uniformity at a given RF power and bias.

In order to accomplish these and other objects of the invention, a method of manufacturing is provided including the steps of forming a plasma including electrons and charged species, applying an electric field across the plasma, and confining the plasma with a variable magnetic field having a gradient of field strength which decreases in the direction of drift of electrons in response to the electric field and magnetic field developed in response to currents in a plurality of coils.

In accordance with another aspect of the invention, an apparatus is provided for plasma processing of a material including a source of RF power to produce a plasma, at least three electromagnets including respective current drivers therefor, a function generator for producing a waveform including a fundamental frequency and at least one harmonic of the fundamental frequency, and an arrangement for providing the waveform to respective ones of the current drivers at respective times to produce a rotating magnetic field which is asymmetric and decreasing in intensity in the direction of ExB drift of electrons in the plasma.

In accordance with a further aspect of the invention, a method of operating a plasma processing device having a plurality of electromagnets and a source of RF power to provide a plasma is provided including the steps of energizing the plurality of electromagnets asymmetrically to produce a magnetic field having a gradient of magnetic field intensity decreasing in a direction of ExB electron drift with a waveform including a fundamental frequency and at least one harmonic of the fundamental frequency, and adjusting relative magnitude of the harmonic relative to the fundamental frequency.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic perspective view of an exemplary multiple stationary coil arrangement in a commercial reactive ion etching reactor, FIGS. 2A and 2B show cross-sections of the arrangement of FIG. 1 at section 2—2 thereof and magnetic fields produced thereby at two slightly separated times during conventional operation, FIG. 2C shows current waveforms for producing the magnetic fields shown in FIGS. 2A and 2B, FIGS. 3A and 3B show cross-sections of the arrangement of FIG. 1 at section 2—2 thereof and magnetic fields produced thereby at two slightly separated times during operation in accordance with the invention, FIG. 4C shows a cross-section of the arrangement of FIG. 1 and illustrates the magnetic field produced by the waveform of FIG. 4B, FIGS. 5A and 5B show further variant waveforms useful in the practice of the invention, and FIG. 6 shows a cross-section of the arrangement of FIG. 1 at section 2—2 thereof and magnetic fields produced thereby in accordance with the waveforms of FIG. 5B.

DETAILED DESCRIPTION OF A PREFERRED EMBODIMENT OF THE INVENTION

Figure 3A:
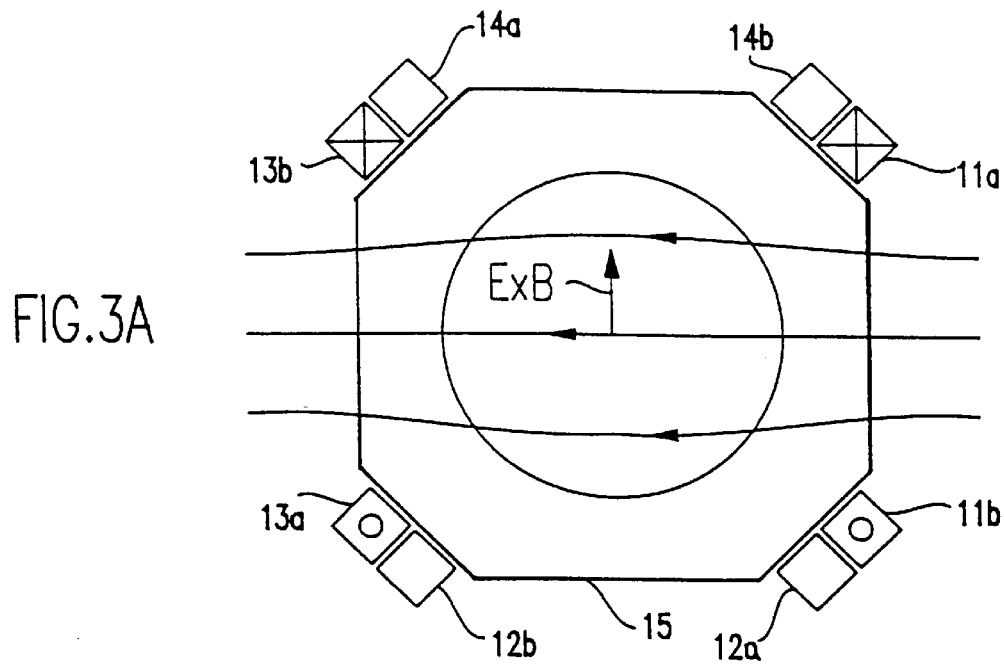

Referring now to the drawings, and more particularly to FIG. 1, there is shown in perspective view the coil arrangement of an exemplary reactive ion etching (RIE) reactor vessel or chamber 15, shown in plan view in FIGS. 2A, 2B, 3A, 3B, 4C and 6. It is to be understood that while the invention will be described below in regard to a reactive ion etching process, plasmas are also employed in many other processes which may be involved in the manufacture of semiconductor electronic devices such as plasma enhanced chemical vapor deposition (PECVD). Since the behaviors of charged particles in electric and magnetic fields are independent of the purpose for which the plasma is developed, the invention is applicable to the control of plasmas used in processes and apparatus other than for reactive ion etching in which uniformity of plasma density and potential are of importance.

It is also to be understood that while the coil geometry illustrated in FIG. 1 represents tools now in use, no admission is made that any portion of FIG. 1 is prior art in regard to the present invention. In particular, the magnetic fields and motion thereof producible by such geometry is dependent on the electrical currents in the coils (e.g. electromagnets) and the manner in which the coils are connected to current drivers (e.g. 90 of FIG. 3B) which are not depicted in FIG. 1 and, as will be discussed below, the invention differs significantly from known techniques of driving the arrangement of FIG. 1.

Specifically, the arrangement of FIG. 1 includes four generally rectangular coils 10, 20, 30, 40 located with axes on or parallel to (e.g. above) orthogonal diameters of wafer 50. Conventionally these coils are connected in pairs (generally in series so that currents in each coil of a pair will be identical to each other) having a common axis. Thus, when a pair of coils is energized, as illustrated in FIG. 2A, a relatively uniform Helmholtz magnetic field 16 is developed across wafer 50. (In FIGS. 2A, 2B, 3A, 3B and 6, which are all taken along section line 2—2 of FIG. 1, current in respective vertical legs 11a, 11b, 12a, 12b, 13a, 13b, 14a and 14b of coils 10, 20, 30 and 40, respectively, is illustrated by the convention of a cross indicating a current into the plane of the page and a circle indicating a current out of the plane of the page.)

Since an electric field E (FIG. 1) is produced toward the wafer (into the page in the top section shown in FIG. 2A along the section lines 2—2 shown in FIG. 1) by the rectification effect of the plasma and capacitance of the RF power source, energetic electrons will drift in a direction perpendicular to both the electric field and the magnetic field. This effect is thus referred to as a ExB drift. The ExB drift will be in the direction shown, resulting in further ionization of the plasma and a gradient of plasma density and plasma potential across the wafer, as alluded to above.

When both pairs of coils are energized (but at a reduced current if sinusoidally varying currents separated in phase by 90° are used, as is conventional and illustrated in FIG. 2C), a similar, substantially uniform magnetic field is produced across the wafer which is rotated 45° counter-clockwise from that of FIG. 2A as shown in FIG. 2B. (It should be noted from FIG. 2C that currents 1 and 3 and 2 and 4 are inverted with respect to each other. Conventionally therefore, these inversions are achieved by connection of the respective coils of a pair and only two current drivers are used. Four waveforms are illustrated in FIG. 2C to observe identical connection conventions for all four coils in order to facilitate comparison with waveforms utilized in the practice of the invention.) The ExB drift direction is similarly rotated in the same direction and by the same amount so that further ionization will occur and cause the gradient of plasma density and plasma potential which may cause damage on the wafer as alluded to above.

Figure 3B:
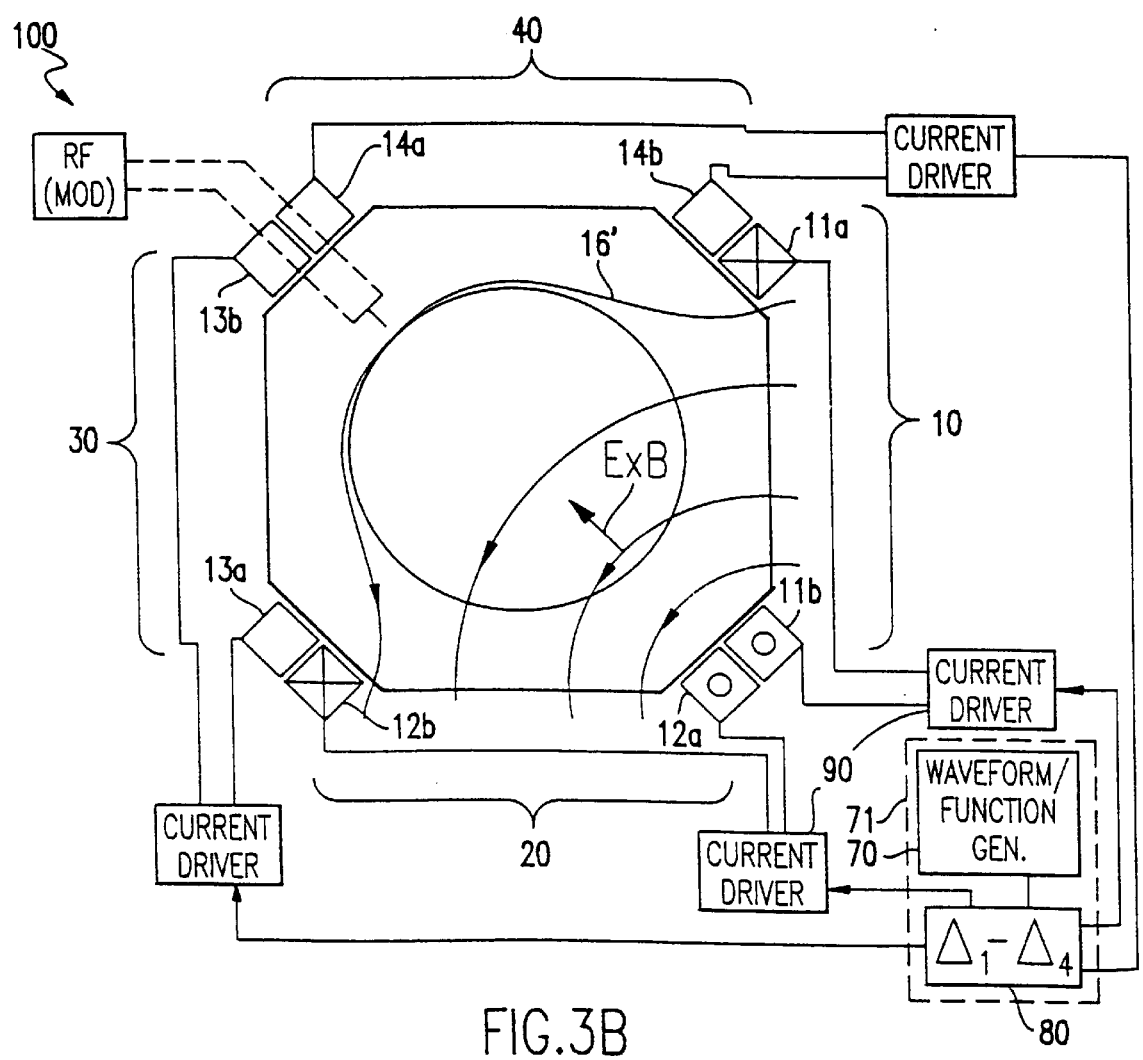

However, if the coils are not driven in pairs and adjacent coils are energized as shown in FIG. 3B, the magnetic field 16' is substantially changed and a gradient of magnetic field strength or intensity is developed such that magnetic field strength decreases in the direction of ExB drift. It will be recognized that the energization illustrated in FIG. 3B is the same as that for coil legs 11a, 11b 12a and 12b of FIG. 2A but with no current in the other two coils. Thus, with only two adjacent coils energized which are asymmetrically arranged within the reactor and relative to the wafer location, a gradient of magnetic field strength will be produced across the wafer in which the magnetic field strength decreases in the direction of ExB drift. Thus drift of energetic electrons and further ionization will be compensated by reduced confinement of the plasma in the direction of ExB drift and plasma density and potential will become more uniform across the wafer.

It should be appreciated that the presence of the average magnetic field continues to confine the plasma allowing reduction of bias while the non-uniformity of the magnetic field increases the uniformity of the density and potential of the plasma entirely independently of rotation of the magnetic field. The fact that uniformity of the plasma density is increased independently of magnetic field rotation is important to determining the magnetic field gradient and harmonic content to be optimum for the parameters of a particular RIE process, as will be discussed below.

It should be noted that FIG. 3A corresponds to FIG. 2A which produces a uniform magnetic field. If the energization pattern of FIG. 3B follows that of FIG. 3A, the magnetic field will rotate in the same manner as described above in regard to FIGS. 2A and 2B and will also vary between states of being substantially uniform, during which time a gradient of plasma density and potential will develop, and having a gradient of magnetic field strength decreasing in the direction of ExB drift, during which time the plasma density and potential will tend to become more uniform. While this is not the preferred method of operation of the invention, it should be noted that operation in the energization sequence illustrated in FIGS. 3A and 3B will cause the gradient of plasma density and potential to fluctuate and, on average, to be reduced.

Such a mode of operation could potentially provide overall increase of uniformity of average plasma exposure in some cases but since ionization due to ExB drift develops very rapidly (milliseconds or fractions of milliseconds) relative to the maximum speed of field rotation (about one-half second per cycle due to the large inductance, eddy currents and the like which are presented by large coils and yokes and conductivity of the reactor vessel 15 in RIE tools) the ability to increase RF power and tool throughput without wafer damage would not be optimally achieved. By the same token, it should be understood that FIG. 3A is also fairly representative of a relatively uniform magnetic field which would transiently occur as the energization pattern of FIG. 3B is switched from corner to corner to rotate the magnetic field, as will be described below, due to the same inductances and eddy currents which limit speed of field rotation. However, in this latter case, the magnetic field is somewhat less uniform during switching and maximum magnetic field uniformity occurs so transiently that RF power can be increased significantly and throughput of the reactor can be substantially increased without wafer damage.

In the preferred mode of operation, the essential feature of the driving current waveforms to develop a non-uniform magnetic field 16' which decreases in strength in the direction of ExB electron drift is to drive adjacent coils with opposite currents in sequence at each corner of the reactor. That is, with reference to FIG. 3B, when adjacent pairs of coils 10 and 20, 20 and 30, 30 and 40, 40 and 10 are driven in sequence with opposite currents, the non-uniform magnetic field pattern 16' illustrated in FIG. 3B develops a plasma of improved uniformity of density and potential across the wafer and, additionally, the magnetic field can be made to rotate around the chamber to sweep the plasma across the wafer surface to further improve uniformity of average exposure to the plasma by averaging exposure of the wafer to any variations in plasma density which remain.

Further, referring briefly back to FIGS. 2A and 2B and recalling that the use of sinusoidally varying currents result in a substantially constant and uniform magnetic field, increasing the harmonic content will also beneficially increase magnetic field non-uniformity in a repeated time-varying manner as the non-uniform field of FIG. 3B is swept around the chamber and will thus increase both plasma density and uniformity of plasma potential to which the wafer 50 is exposed. That is, increased harmonic content as shown in FIGS. 4B, 5A and 5B will cause a beneficial increase in magnetic field non-uniformity during each phase of magnetic field rotation and further, will effectively cause a faster field rotation to be superimposed on magnetic field rotation at the fundamental frequency. Thus increased harmonic content shown in the waveforms of FIGS. 4B, 5A or 5B develops a combined non-uniformity of magnetic field which further increases uniformity of average wafer exposure to plasma density and potential.

In any event, some increase of harmonic content in addition to the fundamental magnetic field rotation frequency is preferred and must be provided to obtain asymmetric energization of coils in the manner discussed above in regard to FIG. 3B. The number and magnitude of the included harmonics can be readily modified by filtering, digital waveform generation (e.g. a function generator 70 of FIG. 3B) or other techniques which will be apparent to those skilled in the art in view of this description of the invention.

Figure 4A:
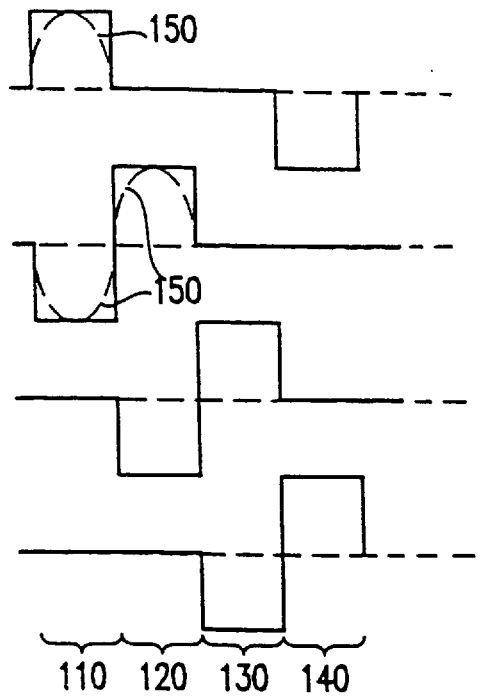
FIGS. 4A and 4B show waveforms used in accordance with the invention for respective variations of operation of the invention.
Figure 4B:
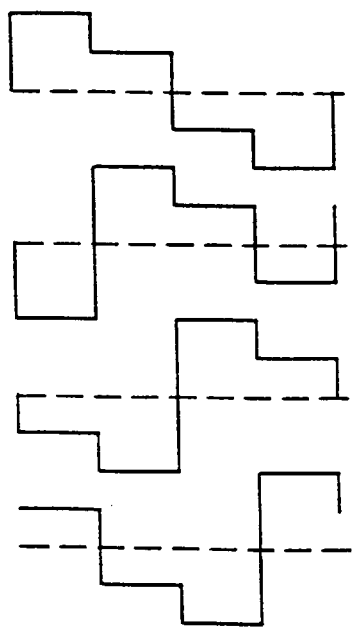

Thus, an extreme case of the preferred mode of operation of the invention is illustrated in FIG. 4A in which a square wave where the current is zero on alternate cycles is applied to each coil with a phase offset of 90° (achieved with delays 80 or a plurality of waveform generators schematically indicated at 71), corresponding to the four coils shown, between each pair of adjacent coils. That is, when current 1 is applied to coil 10, current 2 is applied to coil 20, current 3 is applied to coil 30 and current 4 is applied to coil 40, during period 110, the currents and magnetic fields are as shown in FIG. 3B, linking coils 10 and 20. Similarly, during period 120, the shape of the magnetic field will be of the same shape but will link coils 20 and 30, during period 130 the magnetic field will again be of the same shape but will link coils 30 and 40 and during period 140, the magnetic field 16' will still remain the same shape but will link coils 40 and 10. A different phase offset would, of course, be used for a greater or lesser number of coils.

In this manner, the non-uniform magnetic field 16' can be made to rotate about the center of the coils and across the wafer. The field strength will also fluctuate during each of periods 110, 120, 130 and 140 due to the inductance of the coils and harmonic content of the driving current and will, in a repeatable manner, increase average uniformity of plasma density across the wafer.

In this latter regard, it should be understood that the current waveforms of FIG. 4A are an extreme and idealized case of the preferred operation of the invention with maximum harmonic content which may not be required for maximum uniformity of average plasma exposure across the wafer and may be difficult to achieve in view of the large eddy currents produced by the coils 10–40 and the conductive chamber. Reducing the rise and fall slew rates of the current drivers 90 as shown at 150 of FIG. 4A also reduces harmonic content and it is expected that the practice of the invention will be optimized by regulation of the harmonic content of the applied waveforms.

As indicated above, the invention provides for improved uniformity of plasma density independently of magnetic field rotation and harmonic content can be optimized and the etching tool calibrated by interpolation among results of a small number of etching (or other) processes performed without magnetic field rotation followed by inspection to determine resulting plasma exposure uniformity. Alternatively, the invention can be practiced to advantage if the net current in adjacent legs (e.g. 12a and 11b) of adjacent coils is about or more than 1.5 times the net current in any two adjacent legs of any other two adjacent coils to assure a sufficient degree of asymmetry to establish a gradient of magnetic field strength above the area where etching or other plasma process is to be performed. For example, the waveforms of FIG. 4 would provide a net current in adjacent legs of adjacent coils which is twice the net current in any other adjacent legs of any other adjacent coils.

As a perfecting feature of the invention (which can also be considered as an adjustment of the harmonic content of the driving waveforms) all four coils (or more if provided) can be simultaneously driven. That is, the current in some coils need not be zero when other coils are driven. It is only necessary to the successful practice of the invention that the driving of the coils develop a magnetic field with sufficient asymmetry to cause a gradient of magnetic field strength which decreases in the direction of ExB drift to reduce further ionization.

More specifically, the current waveforms shown in FIG. 4B (and FIG. 5A, as will be described below) provide for fully driving two adjacent coils while driving remaining coils with a lower current. It should be noted, as shown in FIG. 4C, that all four coils are driven in the same sense as that shown in FIG. 2B; the reduced current in the legs of respective coils being depicted by dashed crosses and circles therein. This waveform approximates the waveform which would result from limiting the harmonic content of the energizing current to the second and fourth harmonics in addition to the fundamental and at the same amplitude. The amplitude of the lower current level should be chosen such that the net current in adjacent vertical legs of two adjacent coils approximates or exceeds 1.5 times the net current in adjacent vertical legs of any other pair of coils, as alluded to above. As illustrated in FIG. 4C, the resulting magnetic field remains asymmetric although to a lesser degree than shown in FIG. 3B and a correspondingly reduced gradient of the magnetic field decreasing in magnetic field strength in the direction of ExB drift is illustrated by the increasing spacing of field lines across the wafer.

Therefore, further ionization due to ExB electron drift in this variation of the invention will be reduced but to a lesser degree than in the embodiment of FIG. 3B but may provide good uniformity in some processes and tools for which the embodiment of FIGS. 3B and 4A would be used. Depending on parameters such as wafer and/or chamber size, average magnetic field, electron density and collision frequency, the amount of current drive in the opposed coils can be adjusted as described above to derive the best instantaneous plasma uniformity. In this regard and as a further perfecting feature of the invention, the applied RF power applied to form the plasma may be modulated either in graded or discrete regions of the wafer or throughout the reactor in synchronism with alteration of magnetic field strength, as indicated at 100 of FIG. 3B to make wafer bias more uniform as current is shifted from one pair of coil legs to the next. That is, when the magnetic field is decreased during switching of the energization waveforms, the RF power is decreased to maintain constant wafer bias potential since wafer bias will tend to increase when the magnetic field decreases.

For some plasma process parameters and tools, it may be desired to increase the magnetic field gradient beyond that available from the waveforms of FIG. 4A as discussed above. To increase the gradient, the waveforms of FIG. 4B can be modified to effectively reverse the sense of the lower level driving current in the variation of FIGS. 4B and 4C, as shown in FIGS. 5B and 6.

In this case (which corresponds to an increase in harmonic content), the magnetic field 16" can be reduced to zero and even reversed at a location within the chamber 15 and potentially above the wafer although it is considered preferably to limit the location of field reversal to locations beyond the edge of the wafer. Such an arrangement provides for dispersal of the ExB drift as indicated by arrows ExB' which further reduces ionization due to energetic electrons to an even greater degree than in other variations of the invention described above. RF power is reduced in order to make the wafer bias more uniform as the magnetic field changes. RF power modulation is particularly desirable when the currents reduce the magnetic field confining the plasma to zero at a location above the wafer.

In view of the foregoing, it is seen that the invention, by providing for an asymmetrical magnetic field with a gradient of field strength decreasing in the direction of ExB electron drift provides numerous techniques for optimizing uniformity of plasma density, plasma potential and wafer bias for particular plasma process parameters such as particular gases and pressures in a manner which is independent of magnetic field rotation. This allows RF power to be increased and/or modulated in synchronism with variation of magnetic field strength to further increase uniformity of wafer bias and tool throughput without damage to the wafer or delicate structures thereon. Further, for a given RF power, bias and pressure, the invention provides increased efficiency of tool operation since plasma density can be maximized over a greater area.

While the invention has been described in terms of a single preferred embodiment, those skilled in the art will recognize that the invention can be practiced with modification, such as including more or fewer coils symmetrically arranged around the wafer or a plurality of wafers, within the spirit and scope of the appended claims.

Having thus described my invention, what I claim as new and desire to secure by Letters Patent is as follows:

1. A method of manufacturing including the steps of forming a plasma including electrons and charged species, applying an electric field across the plasma, and confining the plasma with a variable magnetic field having a gradient of field strength which decreases in the direction of drift of electrons in response to said electric field and said magnetic field and wherein said magnetic field is developed in response to currents in a plurality of coils.

2. A method as recited in claim 1, including the further step of rotating said magnetic field.

3. A method as recited in claim 1, wherein said currents and said magnetic field vary at a fundamental frequency and a harmonic of said fundamental frequency.

4. A method as recited in claim 3, including the further step of modulating said RF power in synchronism with variation of said magnetic field.

5. A method as recited in claim 1, wherein said currents are square waves with zero current during alternating cycles.

6. A method as recited in claim 1, wherein the number of coils in said plurality of coils is four.

7. Apparatus for plasma processing of a material, said apparatus including a source of RF power to produce a plasma, at least three electromagnets including respective current drivers therefor, and a function generator means for producing a waveform including a fundamental frequency and at least one harmonic of said fundamental frequency, and means for providing said waveform to respective ones of said current drivers at respective times to produce a rotating magnetic field, said magnetic field being asymmetric and decreasing in intensity in the direction of ExB drift of electrons in said plasma.

8. Apparatus as recited in claim 7, including a function generator means for each of said electromagnets.

9. Apparatus as recited in claim 7, wherein said means for providing said waveform to respective ones of said current drivers includes delay means for providing a delay of said waveform to at least two of said respective current drivers.

10. Apparatus as recited in claim 7, including four electromagnets.

11. Apparatus as recited in claim 7, including means for modulating said RF power in synchronism with application of said waveform to respective ones of said current drivers.

12. A method of operating a plasma processing device having a plurality of electromagnets and a source of RF power to provide a plasma, said method including the steps of energizing said plurality of electromagnets asymmetrically to produce a magnetic field having a gradient of magnetic field intensity decreasing in a direction of ExB electron drift with a waveform including a fundamental frequency and at least one harmonic of said fundamental frequency, and adjusting relative magnitude of said harmonic relative to said fundamental frequency.

13. A method as recited in claim 12, including the further step of adjusting the number of harmonics utilized in said energizing step.

14. A method as recited in claim 12, including the further step of energizing said plurality of electromagnets in timed sequence with said waveform to rotate.

15. A method as recited in claim 13, including the further step of energizing said plurality of electromagnets in timed sequence with said waveform to rotate.

16. A method as recited in claim 12, including the further step of introducing an etchant into said plasma processing device.

17. A method as recited in claim 14, including the further step of introducing an etchant into said plasma processing device.

18. A method as recited in claim 15, including the further step of introducing an etchant into said plasma processing device.

* * * * *

UNITED STATES PATENT AND TRADEMARK OFFICE
CERTIFICATE OF CORRECTION

PATENT NO. : 5,880,034
DATED      : March 9, 1999
INVENTOR(S) : John H. Keller

It is certified that error appears in the above-identified patent and that said Letters Patent is hereby corrected as shown below:

Title page, item [73], Assignee: change "Princeton University, Princeton, N.J." to --International Business Machines Corporation, Armonk, N.Y.--.

Signed and Sealed this

Eleventh Day of April, 2000

*Attest:*

Q. TODD DICKINSON

*Attesting Officer*  *Director of Patents and Trademarks*